United States Patent [19]
van de Plassche et al.

[11] Patent Number: 4,555,676
[45] Date of Patent: Nov. 26, 1985

[54] DUAL-SECTION AMPLIFIER ARRANGEMENT HAVING A PROTECTION CIRCUIT

[75] Inventors: Rudy J. van de Plassche, Sunnyvale, Calif.; Eise C. Dijkmans, Eindhoven, Netherlands

[73] Assignee: U.S. Philips Corporation, New York, N.Y.

[21] Appl. No.: 569,648

[22] Filed: Jan. 10, 1984

[30] Foreign Application Priority Data

Jan. 11, 1983 [NL] Netherlands ......................... 8300078

[51] Int. Cl.[4] ........................... H03F 1/34; H02H 7/20
[52] U.S. Cl. ..................................... 330/298; 330/85; 330/207 P; 330/255; 330/294
[58] Field of Search .............. 330/85, 107, 109, 207 P, 330/255, 294, 307, 298, 265, 271

[56] References Cited

PUBLICATIONS

Perez, "An 8 W Amplifier with Integrated Circuit", Revista Espanola de Electronica, vol. 26, No. 297–298, pp. 34–39, Aug.–Sep. 1979.

Primary Examiner—James B. Mullins
Attorney, Agent, or Firm—Robert T. Mayer; Steven R. Biren

[57] ABSTRACT

An amplifier arrangement includes a first section and a second section. The second section has an output transistor which is protected by a protection circuit. The protection circuit acts on the input of the second section in order to obtain a higher gain in the protection loop. In order to preclude instabilities, the protection circuit has a falling frequency response with a flat portion in view of the frequency compensation of the second section.

6 Claims, 9 Drawing Figures

DUAL-SECTION AMPLIFIER ARRANGEMENT HAVING A PROTECTION CIRCUIT

BACKGROUND OF THE INVENTION

The invention relates to an amplifier arrangement comprising a first amplifier section having an input and an output, a second amplifier section having an input which is connected to the output of the first amplifier section, an output, at least a first output transistor and a first driver transistor which drives said output transistor, and a protection circuit for overload protection of said output transistor. Such amplifier arrangements are used for example as integrated power amplifiers for audio signals. The output transistors of such amplifiers must be protected against voltage and/or current overloading or overloading by a combination of voltage and current (so-called SOAR protection).

Amplifier arrangements of the type set forth above are known inter alia from DE-PS 18.11.765 and the magazine "Neues aus der Technik", no. 3, 01-07-1977, page 4, publication no. 406.

In these amplifier arrangements the protection circuit has a low gain because the protection acts on the bae of the output transistor. However, this low gain has the drawback that the protection circuit may introduce distortion when this circuit is not activated. This problem cannot readily be solved by increasing the gain factor of the protection circuit because this may give rise to instabilities when the protection circuit is in the activated condition.

SUMMARY OF THE INVENTION

It is the object of the invention to provide an amplifier arrangement of the type set forth above, which arrangement comprises a protection circuit which introduces minimal distortion without the risk of instabilities. To this end the invention is characterized in that the protection circuit forms a loop around the second amplification and acts on the input to the second amplifier section and has a frequency response a portion of which falls off with increasing frequency within the frequency range of the amplifier arrangement.

As the protection circuit acts on the input of the second amplifier section, the gain in the protection loop is increased by utilizing the gain of the driver transistor. The risk of instabilities is precluded by providing a frequency roll-off.

In an amplifier arrangement in which the second amplifier section is frequency-compensated, so that the gain of the second amplifier section falls off at a rate of 6 dB/octave with increasing frequency from a first angular frequency to a point above a second angular frequency where the open-loop gain of the amplifier arrangement is equal to the inverse of the maximum negative-feedback factor for which the amplifier arrangement operates without instabilities, it is not sufficient that the gain of the protection circuit merely falls off as a function of frequency because the frequency compensation of the second amplifier stage gives rise to a phase shift within the falling portion of the protection characteristic. In such a case an amplifier arrangement in accordance with the invention may further be characterized in that the frequency response of the protection circuit exhibits a frequency-independent portion for a range of frequencies above those corresponding to the portion which falls off as a function of frequency, which frequency-independent portion is situated around a third angular frequency which is lower than the second angular frequency, at which third angular frequency the modulus of the open-loop gain through the second amplifier section reaches the value unit when the protection circuit is in the activated condition.

With respect to the protection circuit, an amplifier arrangement in accordance with the invention may further be characterized in that the protection circuit comprises a detection circuit for supplying a signal which is a measure of the voltage and/or current carried by the first output transistor, a frequency-dependent network for obtaining the desired frequency dependence of the transfer characteristic of the protection circuit and a buffer amplifier, and with respect to the frequency-dependent network the amplifier arrangement may further be characterized in that the detection circuit is arranged to supply an output current in an output-current circuit and the frequency-dependent network comprises the series arrangement of a resistor and a capacitance in said output circuit, the voltage across this output circuit being converted into a current via said buffer amplifier, which current is fed to the input of the second amplifier section.

In order to obtain a sharp transition between the active and the inactive range of the protection circuit a preferred amplifier arrangement in accordance with the invention is characterized in that a current source is arranged in parallel with the series arrangement and a unidirectional clamping circuit is arranged at the output of the detection circuit, which clamping circuit clamps the input of the buffer amplifier at a comparatively fixed potential as long as the output current of the detection circuit does not exceed the current from said current source.

Moreover, if this preferred amplifier arrangement comprises a second output transistor which is driven in push-pull with the first output transistor and, in addition to the said protection circuit comprises a second protection circuit, for overload protection of second output transistor, and the first amplifier section comprises a differential pair whose collector signal currents are applied to the second amplifier section in phase opposition, it may be characterized in that the output of one protection circuit is coupled to the collector circuit of one transistor of the differential pair and the output of the other protection circuit is coupled to the collector circuit of the other transistor of the differential pair.

BRIEF DESCRIPTION OF THE DRAWING

The invention will now be described in more detail, by way of example, with reference to the drawing, in which.

DESCRIPTION OF THE PREFERRED EMBODIMENTS

Figure 1:
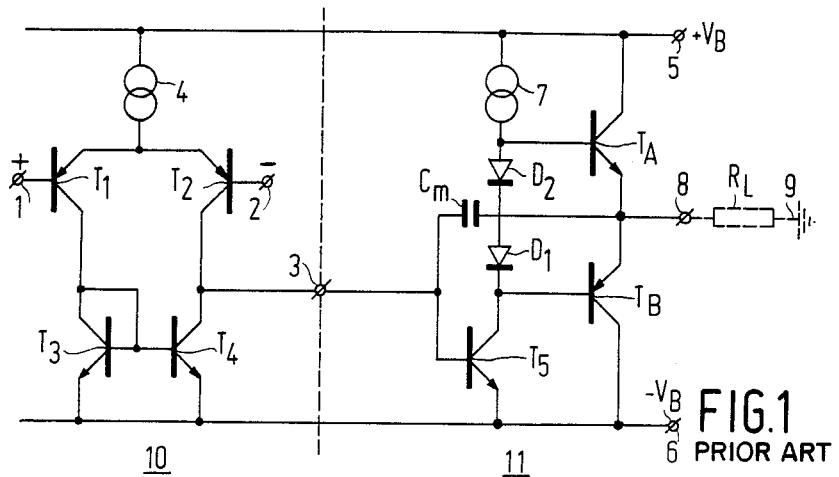
FIG. 1 shows a known amplifier arrangement in which a protection circuit in accordance with the invention may be used.

FIG. 1 shows a known amplifier arrangement to which a protection system may be added in accordance with the invention. The known amplifier is of the same type as the operational amplifiers which are commercially available under type number $\mu A$ 741. The amplifier comprises a first section 10, which has the nature of a voltage-current converter, comprising a pair of transistors $T_1$ and $T_2$ which are arranged as a differential amplifier and whose bases constitute the inverting (1) and non-inverting (2) inputs of the amplifier. The emitters of these transistors $T_1$ and $T_2$ are connected to the positive power-supply terminal 5 via a current source 4. The collectors of the transistors $T_1$ and $T_2$ are connected to an output 3 of said amplifier section 10, the collector of transistor $T_1$ via a current mirror comprising the transistor $T_3$ and $T_4$, which output also constitutes the input 3 of the following section 11, which is a current-voltage converter. This section comprises a driver transistor $T_5$ which drives a conventional class-B output stage comprising an output 8, diodes $D_1$ and $D_2$, output transistors $T_A$ and $T_B$ and a current source 7. The amplifier is frequency compensated in that a Miller capacitor $C_m$ is arranged across the amplifier section 11.

Figure 2:
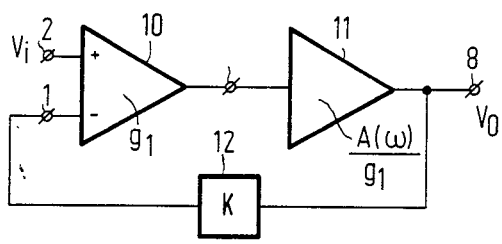
FIG. 2 is a block diagram of the amplifier shown in FIG. 1 provided with negative feedback.
Figure 3:
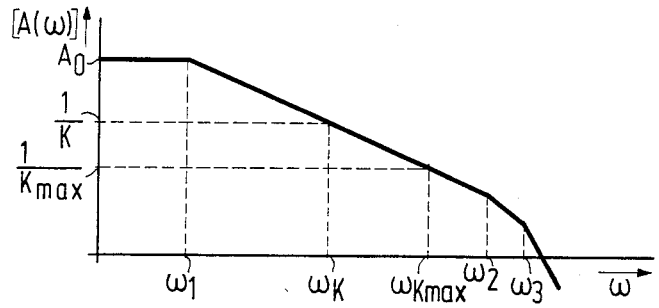
FIG. 3 shows a frequency diagram for the amplifier arrangement shown in FIG. 2.

FIG. 2 is a block diagram of the amplifier arrangement of FIG. 1 provided with a feedback loop and FIG. 3 shows the frequency response of this amplifier to illustrate the frequency behavior of such an amplifier. As can be seen in FIG. 2, the amplifier receives negative feedback via a network 12 between the output 8 of the amplifier section 11 and the input 1 of the amplifier section 10, which network 12 produces a negative-feedback factor k.

The frequency-compensated amplifier without negative feedback as shown in FIG. 1 has the frequency response shown in FIG. 3, the gain $A(\omega)$ being $A_o$ for low frequencies, and falling off by 6 DB/octave from a specific angular frequency $\omega_1$ defined by the compensation capacitor $C_m$ to a frequency $\omega_2$, where a further time constant of the amplifier introduces a frequency roll-off of 12 dB/octave.

If negative feedback is applied to the amplifier with a feedback factor k, the gain of the amplifier will be equal to $1/k$ up to the angular frequency $\omega_k$, where $A(\omega_k) = 1/k$ and above which the frequency response of the amplifier will be the same as for the amplifier without negative feedback. For reasons of stability the frequency roll-of at $\omega = \omega_k$ should not exceed 6 dB/octave and any frequency roll-off exceeding 6 dB/octave should be situated at at least a specific distance from this frequency along the frequency axis. This means that $\omega_k < \omega_2$, so that $$k \leq k_{max} \quad (1)$$

for which $\omega_k \leq \omega_{kmax} < \omega_2$, where $k_{max}$ and the corresponding value $\omega_{kmax}$ are inter alia determined by the value of the angular frequency $\omega_2$. In general, condition (1) applies to an amplifier without a protection circuit and consequently to an amplifier with a protection circuit which is not activated.

When it is assumed that the section 10 has a transconductance $g_1$, the gain of section 11 will be $$\frac{A(\omega)}{g_1}.$$

The amplifier with negative feedback then has a gain factor vo/vi, where vo is the output voltage on output 8 and vi the input voltage on input 2, which is given by:

$$Vo/Vi = \frac{A(\omega)}{1 + A(\omega)k} = \frac{\frac{A(\omega)g_1}{g_1}}{\frac{1 + A(\omega)}{g_1} kg_1} \quad (2)$$

It is to be noted that the angular frequency $\omega_1$ and, as a rule, the annular frequency $\omega_2$ are determined by the second section, so that the gain $g_1$ in the relevant portion of the frequency spectrum is frequency-independent.

Figure 4:
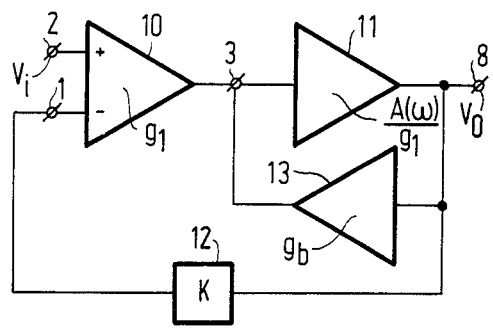
FIG. 4 shows the block diagram of FIG. 2 plus a protection circuit.

FIG. 4 is a block diagram of an operational amplifier provided, in accordance with the invention, with a protection circuit. The diagram is similar to that shown in FIG. 2, except that a protection circuit 13 is provided which acts on point 3 between the two amplifier sections, as distinct from the known protection circuit which acts on the bases of the output transistors. The protection circuit receives its information from the output transistors and when it is activated it constitutes a transconductance amplifier 13 having a transconductance $g_b$ between the output of the amplifier 11 and its input 3. When the protection circuit is activated the gain of the operational amplifier shown in FIG. 4 becomes:

$$Vo/Vi = \frac{A(\omega)}{g_1} \{g_1(V_i - kV_o) - g_b V_o\}$$

which may be written as:

$$Vo/Vi = \frac{A(\omega)}{1 + A(\omega)k} \cdot \frac{1}{1 + \frac{g_b}{g_1} \frac{A(\omega)}{1 + A(\omega)k}} \quad (3)$$

This gain is the gain in conformity with expression (2), i.e. the gain in the absence of the protection circuit, multiplied by a factor $1/f$ which represents the reduction in gain as a result of the actuation of the protection circuit. This reduction factor f complies with:

$$\frac{1}{f} = \frac{1}{1 + \frac{g_b}{g_1} \frac{A(\omega)}{1 + A(\omega)k}}$$

For $A(\omega) \gg 1$ this equation may be reduced to:

$$g_b = g_1 k(f-1)$$

As the reduction factor should be high in order to obtain satisfactory protection, it follows that $$g_b \gg g_1 k \quad (4)$$

Rewriting expression (3) yields:

$$V_o/V_i = \frac{\frac{A(\omega)}{g_1} \cdot g_1}{1 + \frac{A(\omega)}{g_1} \cdot (kg_1 + g_b)} \quad (5)$$

Figure 5:
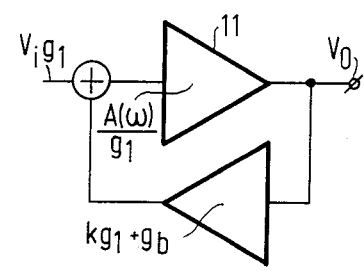
FIG. 5 is a block diagram of a part of the circuit arrangement shown in FIG. 4 in order to explain the operation of this arrangement.

Since the amplifier should remain stable when the protection circuit is in the activated condition, expression (5) should meet the stability criteria. This means that point $-1$ in the Nyquist diagram should not be enclosed. As regards the stability, the amplifier in conformity with expression (5), when ignoring a constant gain factor $g_1$, may be regarded as an amplifier having a gain $$\frac{A(\omega)}{g_1}$$

which receives feedback with a factor $(kg_1 + g_b)$, which amplifier is shown schematically in FIG. 5. In the situation shown in FIGS. 2 and 3, a maximum feedback factor $k_{max}$ must be observed for the amplifier and consequently a maximum feedback factor $k_{max}g_1$ must be observed for the amplifier section 11 in view of the 12 dB/octave roll-off of the characteristic $$\frac{A(\omega)}{g_1}$$

at the angular frequency $\omega_2$ (see also FIG. 6a), so that the same condition must now be imposed:

$$kg_1 + g_b \leq k_{max}g_1 \quad (6)$$
or
$$g_b \leq (k_{max} - k)g_1$$

The stability criterion (6) consequently demands a comparatively small value of the gain $g_b$, whereas the criterion (4) demands that the gain $g_b$ be sufficiently high to achieve a high gain reduction. These two requirements seem to be conflicting except for small values of k and therefore lead to the conclusion that protection in this way is possible only when hardly any negative feedback is applied to the amplifier.

However, in accordance with the invention both requirements can be met because the stability requirement (6) is met for higher frequencies and the requirement (4) of a sufficiently high gain reduction is met for low frequencies. Thus, both requirements can be met when $g_b$ is, for low frequencies, substantially higher than $g_1k$ and has decreased to a value smaller than $(k_{max} - k)g_1$ at the angular frequency $\omega k_{max}$.

In order to meet requirement (6) the point where the modulus of the open-loop gain $$\frac{A(\omega)}{g_1}(kg_1 + g_b)$$

(see expression 5) becomes unity is situated well before $\omega_2$, where $A(\omega_2)$ begins to exhibit a phase shift of 180° (12 dB/octave roll-off). This requirement is not sufficient because the term $(kg_1 + g_b)$ also introduces a phase shift. However, the amplifier becomes stable if requirement (6) is met and if around the point where the modulus of the open-loop gain becomes unity the term $(kg_1 + g_b)$ does not add any significant phase shift to the phase shift of $$\frac{A(\omega)}{g_1},$$

which second requirement is met by making the term $g_b$ frequency-independent around this point.

Figure 6:
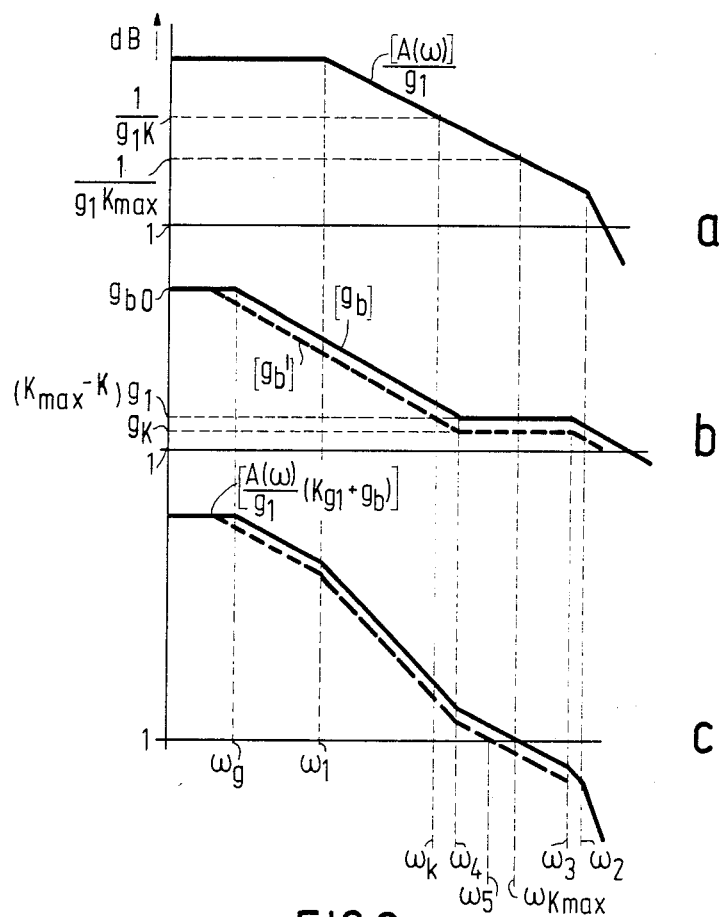
FIG. 6 shows several frequency diagrams for the amplifier arrangement shown in FIG. 4 in order to clarify the operation thereof.

To illustrate this, FIG. 6 shows several frequency diagrams, namely in FIG. 6a the modulus of the gain $$\frac{A(\omega)}{g_1}$$

as a function of the angular frequency $\omega$, in FIG. 6b the modulus of the gain $g_b$ of the protection stage, and in FIG. 6c the modulus of the open-loop gain $$\frac{A(\omega)}{g_1}(kg_1 + g_b)$$

of the amplifier stage 11 when the protection circuit is in the activated condition.

Since the term $g_1$ is assumed to be constant, the characteristic $$\frac{A(\omega)}{g_1}$$

varies in the same way as the characteristic $A(\omega)$ shown in FIG. 3. The negative feedback factor of the amplifier is k, which factor is such that $$\frac{A(\omega k)}{g_1}$$

is equal to $$\frac{1}{g_1k}$$

for $\omega = \omega_k$ and is $$\frac{1}{g_1k_{max}}$$

for $\omega = \omega_{kmax}$.

For $|g_b|$ a variation (FIG. 6b) is selected for which $|g_b|$ for $\omega = 0$ is equal to $g_{bo}$ and for an angular frequency around $\omega = \omega_{kmax}$ is equal to $(k_{max} - k)g_1$, which is the maximum value which is permissible in accordance with expression (6). Outside these points the response is not of great importance, and in the present example it is flat up to $\omega = \omega_g$ followed by a slope of 6 dB/octave up to an angular frequency $\omega = \omega_4$. Above this frequency the response is flat up to an angular frequency $\omega = \omega_3$ where $|g_b|$ falls off further. The combined characteristic (FIG. 6c) is initially flat and, via one or two break points, depending on the situation of the angular frequency $\omega_g$ relative to angular frequency $\omega_1$, it changes to a slope which is 12 dB/octave at most and which depends on the slope of the term $kg_1 + g_b$ in comparison with the 6 dB/octave slope of the term $g_b$ alone, after which the characteristic falls off above the angular frequency $\omega = \omega_4$ at a rate of 6 dB/octave as a result of the flatness of the characteristic for $g_b$ at this frequency. It will be evident that the angular frequency for which this graph intersects the line 1 should lie within a portion of the graph where the slope is substantially smaller than 12 dB/octave, i.e. in the portion where this slope is 6 dB/octave, which requirement is met in this situation.

In the situation as outlined above it is assumed that $g_b = (k_{max} - k)g_1$ for $\omega = \omega_{kmax}$. However, this is the maximum value of $g_b$ which accords with expression 6. Since the various parameters may exhibit a spread and, moreover, may be selected more or less freely (for example the parameter k), $g_b$ will be smaller than the value $(k_{max} - k)g_1$ in practice, so that the value of $|g_b|$ decreases (dotted characteristic in FIG. 6b) as a result of which the value of $$\left| \frac{A(\omega)}{g_1} (kg_1 + g_b) \right|$$

decreases (dotted characteristic in FIG. 6c) and the line $$\left| \frac{A(\omega)}{g_1} (kg_1 + g_b) \right| = 1$$

is intersected at an angular frequency $\omega_5$ which is lower than the angular frequency $\omega_{kmax}$. The flat portion of the characteristic $g_b$ should therefore be sufficiently wide to encompass the frequency $\omega_5$. A decrease of $g_b$ relative to the value $(k_{max} - k)g_1$ for high frequencies may occur when the term $kg_1$ increases or the quantity $g_b(\omega_1)$ ($g_b$ for the value $\omega = \omega_1$) decreases or when the effect of the negative feedback via the protection circuit 13 decreases in comparison with the effect of the negative feedback via the negative-feedback path 12. In the term $kg_1 + g_b$ this means a decrease in the effect of the phase shift of the frequency-dependent term $g_b$. If this decrease of $g_b(w_1)$ in comparison with $(k_{max} - k)g_1$ is such that $g_b >> kg_1$, the point where $$\left| \frac{A(\omega)}{g_1} (kg_1 + g_b) \right| = 1$$

will be situated at $\omega = \omega_k$.

Thus, when the flat portion of the characteristic for $g_b$ extends further than the angular frequency $\omega_k$ no stability problems are envisaged. The angular frequency $\omega_k$, however, depends on the negative feedback factor k. However, in practice a rather accurately defined value will be required for the negative feedback factor k, so that the stability requirements can be met. In a practical version the selected values were $3\omega_4 \leq w_{kmax} \leq \frac{1}{3}\omega_3$.

Figure 7:
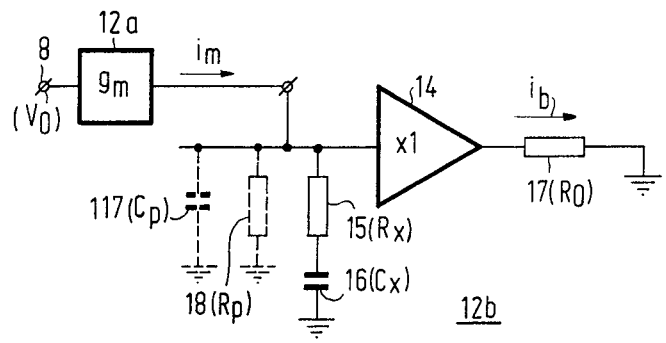
FIG. 7 shows a version of the protection circuit 13 (FIG. 4)

FIG. 7 shows a version of a protection circuit 12 providing the frequency response shown in FIG. 6b. The protection circuit comprises a frequency-independent section 12a, which in addition to those from output 8 can also receive other input signals, and a section 12b which determines the frequency response. The section 12a, having a transconductance $g_m$, supplies a current $i_m$. This current is converted into a voltage by means of an RC-network comprising a resistor 15 having a resistance $R_x$ and a capacitor 16 having a capacitance $C_x$, which voltage is converted into a current $i_b$ through a resistor 17 having a value Ro via a buffer amplifier 14, for example an emitter follower. Moreover, the circuit comprises a spurious capacitance 117 of the value Cp and a leakage resistance 18 of a value Rp, which are responsible for the break-points at $\omega = \omega_g$ and $\omega = \omega_3$ in the characteristic of FIG. 6b. The transfer function is $$\frac{i_b}{V_0} = g_b = g_m \frac{R_p(1 + j\omega\tau_2)}{R_o(1 + j\omega\tau_1)(1 + j\omega\tau_3)} \quad (7)$$

where
$\tau_1 = R_p(C_x + C_p)$
$\tau_2 = R_x(C_x + C_p)$
$\tau_3 = R_x C_p$

The various parameters in the characteristic of FIG. 6b are then as follows:

$$g_{bo} = g_m \frac{R_p}{R_o}$$

$$g_k = g_m \frac{R_x}{R_o}$$

$$\omega_g = \frac{1}{R_p(C_x + C_p)}$$

$$\omega_4 = \frac{1}{R_x(C_x + C_p)}$$

$$\omega_3 = \frac{1}{R_x C_p}$$

Figure 8:
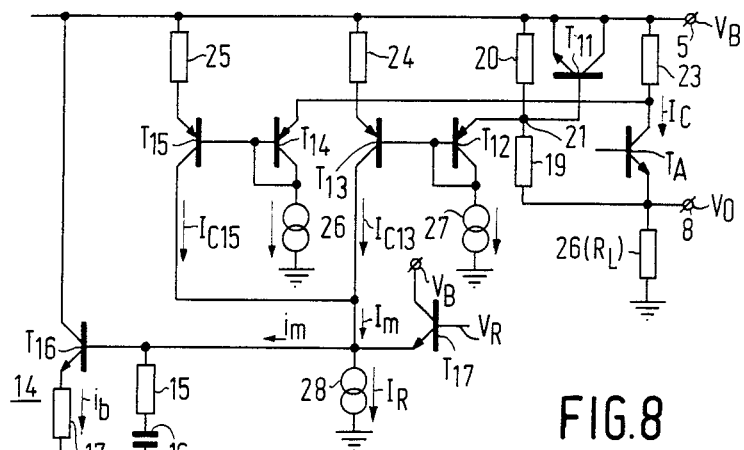
FIG. 8 shows in more detail a version of the detection circuit 12 shown in FIG. 7.

FIG. 8 shows a practical version of the protection circuit 13 shown in FIG. 7. An output transistor $T_A$ to be protected has its collector connected to the positive power-supply terminal 5 via a sensing resistor 23 having a resistance value $R_{23}$ (for example $0.03\Omega$) and its emitter connected to the output 8, to which a terminating impedance 26 of the value $R_L$ is connected. The transistor $T_A$ must be protected against excessive currents and excessive voltages and a combination of the two (so-called SOAR protection). For this purpose the collector current $I_C$ is measured by means of the resistor 23. The resistor 23 forms part of the input circuit of a current mirror comprising transistors $T_{14}$ and $T_{15}$, a resistor 25 and an input-current source 26.

When the currents through transistors $T_{14}$ and $T_{15}$ and/or the voltages across the resistors 23 and 25 are such that the difference between the base-emitter voltages of transistors $T_{14}$ and $T_{15}$ is of subordinate importance, the output current $I_{C15}$ will be such that the voltages across the resistors 23 and 25 are substantially equal to each other, which can be achieved over an adequately wide range of the current $I_C$ to be measured. The current $I_{C15}$ is then:

$$I_{C15} = \frac{R_{23}}{R_{25}} I_C + I_1 \quad (8)$$

where $R_{23}$ is the value of the resistor 23, $R_{25}$ the value of the resistor 25, and $I_1$ a direct current term as a result of the current from the current source 26.

In order to measure the collector voltage of the transistor $T_A$ a resistive divider comprising the resistors 19 (of the value $R_{19}$) and 20 (of the value $R_{20}$) is connected between the power-supply terminal 5 and the output 8. The resistor 20 is also the resistor in the input circuit of a current mirror comprising transistors $T_{12}$ and $T_{13}$, the resistors 20 and 24 (of the value $R_{24}$) and the direct-current source 27. The voltage on the junction point of the resistors 19 and 20 is limited by a transistor $T_{11}$ arranged as a Zener diode.

When it is assumed that the difference between the base-emitter voltages of the two transistors $T_{12}$ and $T_{13}$ plays a subordinate role, the voltages across the resistors 20 and 24 will be substantially equal to each other in this current mirror. The collector current $I_{C13}$ of transistor $T_{13}$ is then:

$$I_{C13} = I_2 = I_2 - \frac{R_{20}}{(R_{19} + R_{20})R_{24}} V_o \quad (9)$$

where $I_2$ is a direct current term caused by the current from the input-current source 27.

From the expressions (8) and (9) and the relationship $I_C = V_o/R_L$ ($R_L$ is the value of the load connected to output 8), the following can be derived for $i_M = I_{C13} + I_{C15}$:

$$i_M = I_1 + I_2 + \left( \frac{R_{23}}{R_{25}R_L} - \frac{R_{20}}{(R_{19} + R_{20})R_{24}} \right) V_o \quad (10)$$

This means that the transconductance $g_m$ in equation (7) is:

$$g_m = \frac{R_{23}}{R_{25}R_L} - \frac{R_{20}}{(R_{19} + R_{20})R_{24}}$$

In this respect it is to be noted that since the load $R_L$ now appears in the transfer characteristic, care must be taken that it has a resistive nature, at least in the relevant frequency range around $\omega_k$. The current $I_R$ from the current source 28 is subtracted from this current $I_M$, thus defining the activation point of the protection circuit. When the current $I_M$ exceeds the current $I_R$ the difference $i_m$, in the same way as in the case of FIG. 7, flows through the series arrangement of the resistor 15 and the capacitor 16 and the voltage thus obtained is applied to resistor 17 via amplifier 14, comprising the emitter-follower transistor $T_{16}$, which resistor 17 is arranged between the emitter of transistor $T_{16}$ and the junction point 3 between the amplifier stages 10 and 11. The base-emitter junction between point 3 and ground hardly affects the current-voltage conversion across the resistor 17.

In the protection circuit of FIG. 8, the base of transistor $T_{16}$ is clamped at a point carrying the reference voltage $V_R$ by means of a transistor $T_{17}$. This step serves to preclude the activation of the protection circuit 13 when protection is not required and the current $i_m$ does not exceed a specific value $I_R$. Conduction of the clamping transistor $T_{17}$ is sustained by the excess current from the current source 28. Indeed, when the current $I_C$ or the voltage $V_o$ is such that the voltage drop across the resistors 20 and 23 is inadequate, the sum of the output currents of the associated current mirrors $T_{14}$, $T_{15}$ and $T_{12}$, $T_{13}$ will be smallwer than the current $I_R$ so that the current source 28 can produce a current through transistor $T_{17}$. The voltage $V_R$ is such that the transistor $T_{16}$ is not turned on when the protection circuit is not activated. If the protection circuit is activated, transistor $T_{17}$ is cut off because the current $I_M$ exceeds the value $I_R$ and transistor $T_{16}$ is turned on. This results in a very sharp transition between the two states (activated and non-activated).

Figure 9:
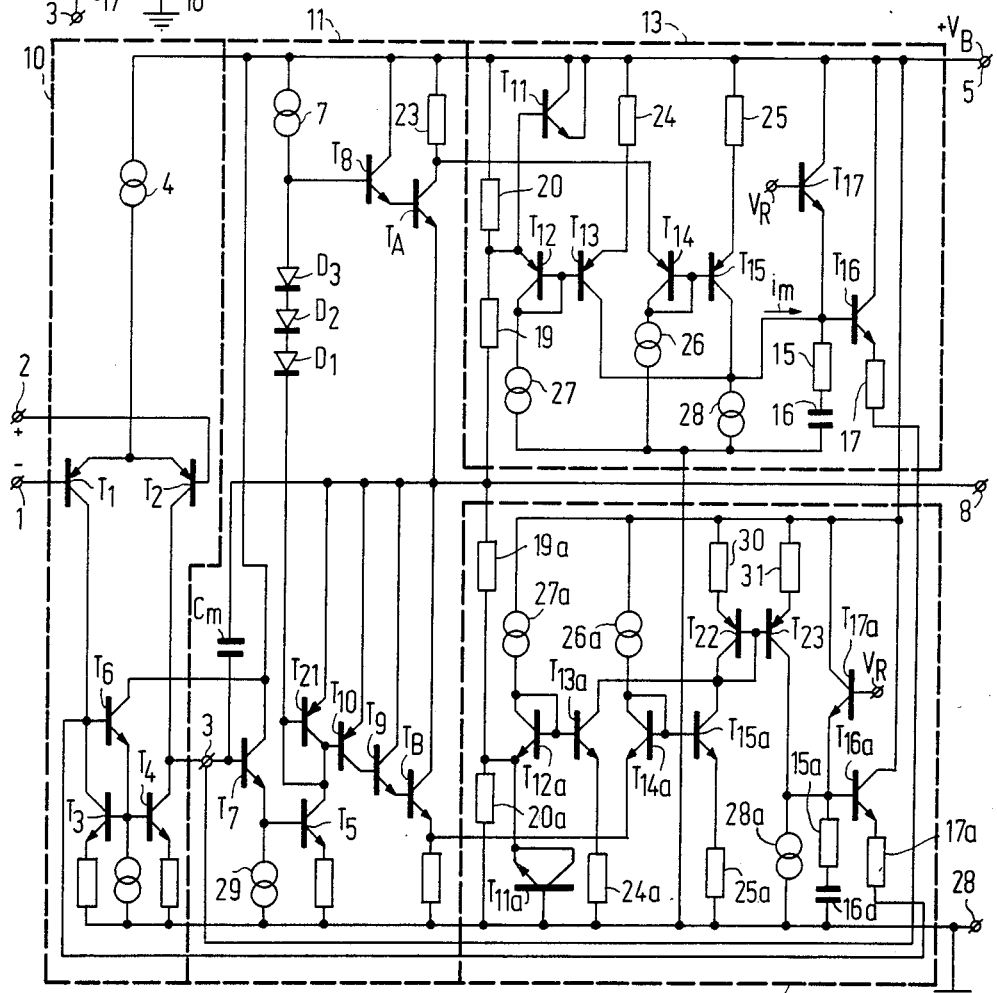
FIG. 9 shows a preferred embodiment of the invention.

FIG. 9 shows a preferred embodiment of the invention. The first (10) and second (11) amplifier sections are essentially the same as those in the circuit arrangement shown in FIG. 1 and corresponding parts bear the same reference numerals. In the transconductance amplifier 10 the collector-base coupling across transistor $T_3$ is formed by the base-emitter junction of a transistor $T_6$. In the output amplifier 11 a driver transistor $T_5$ is arranged as a Darlington stage with transistor $T_7$ and current source 29, while the output stage itself is arranged as a quasi-complementary output stage with Darlington output transistors in that the output transistors $T_A$ and $T_B$ are of the same conductivity type and form a Darlington arrangement with transistors $T_8$ and $T_9$, respectively. The quasi-complementary behavior is obtained by the addition of the pnp-transistors $T_{10}$ and $T_{21}$, as is shown in the Figure. Output transistor $T_A$ is protected by a circuit 13 which is identical to the circuit shown in FIG. 7 and whose parts bear the same reference numerals. Output transistor $T_B$ is protected in a similar manner by means of a circuit 13a, which largely corresponds to the circuit 13 and of which corresponding parts bear the same reference numerals with the index a. This circuit operates in the same way as the circuit shown in FIG. 7, but the current mirrors comprising the transistors $T_{12a}$ to $T_{15a}$ are of the complementary type, so that the current $i_m$ is reflected to the base of transistor $T_{16a}$ by means of a current mirror comprising transistors $T_{22}$ and $T_{23}$ and resistors 30 and 31.

Via resistor 17 the emitter of transistor $T_{16}$ is coupled directly to point 3. The emitter current of transistor $T_{16a}$ must be inverted because of the complementary drive of transistor $T_B$ from point 3. This is effected by connecting the emitter of transistor $T_{16a}$ to the input of the current mirror $T_3$, $T_4$ via resistor $17a$, so that this current mirror inverts the emitter current of said transistor to output 3.

What is claimed is:

1. An amplifier arrangement comprising a first amplifier section having an input and an output, a second amplifier section having an input which is connected to the output of the first amplifier section, an output, at least a first output transistor and a first driver transistor which drives said output transistor, and a protection circuit for overload protection of said output transistor, characterized in that the protection circuit forms a loop around the second amplifier section, acts on the input to the second amplifier section, and has a frequency response a portion of which falls off with increasing frequency within the frequency range of the amplifier arrangement.

2. An amplifier arrangement as claimed in claim 1, the second amplifier section of the amplifier arrangement being frequency compensated, so that the gain of the second amplifier section falls off at a rate of 6 dB/octave with increasing frequency from a first angular frequency to a point above a second angular frequency where the open-loop gain of the amplifier arrangement is equal to the inverse of the maximum negative-feedback factor for which the amplifier arrangement operates without instabilities, characterized in that the frequency response of the protection circuit exhibits a frequency-independent portion for a range of frequencies above those corresponding to the portion which falls off as a function of frequency, which frequency-independent portion is situated around a third angular frequency which is lower than the second angular frequency, at which third angular frequency the modulus of the open-loop gain through the second amplifier section reaches the value unity when the protection circuit is in the activated condition.

3. An amplifier arrangement as claimed in claim 2, characterized in that the protection circuit comprises a detection circuit for supplying a signal which is a measure of at least one of the voltage and current carried by the first output transistor, a frequency dependent network for obtaining the desired frequency dependence of the transfer characteristic of the protection circuit and a buffer amplifier.

4. An amplifier arrangement as claimed in claim 3, characterized in that the detection circuit is arranged to supply an output current in an output-current circuit and the frequency-dependent network comprises the series arrangement of a resistor and a capacitance in said output circuit, the voltage across this output circuit being converted into a current via said buffer amplifier, which current is fed to the input of the second amplifier section.

5. An amplifier arrangement as claimed in claim 4, characterized in that a current source is arranged in parallel with said series arrangement and a unidirectional clamping circuit is arranged at the output of the detection circuit, which clamping circuit clamps the input of the buffer amplifier at a fixed potential as long as the output current of the detection circuit does not exceed the current from said current source.

6. An amplifier arrangement as claimed in claim 1, 2, 3, 4 or 5, which comprises a second output transistor which is driven in push-pull with the first output transistor, which in addition to said protection circuit comprises a second protection circuit for overload protection of said second output transistor, and in which the first amplifier section comprises a differential pair whose collector signal currents are coupled to the second amplifier section in phase opposition, characterized in that the output of one protection circuit is coupled to the collector circuit of one transistor of the differential pair and the output of the other protection circuit is coupled to the collector circuit of the other transistor of the differential pair.

* * * * *